(12) United States Patent
Binner et al.

(10) Patent No.: US 6,432,477 B1
(45) Date of Patent: Aug. 13, 2002

(54) DENSIFICATION OF POROUS BODIES

(75) Inventors: Jonathan Graham Peel Binner, Long Eaton; Toby John Hutton, Leamington Spa, both of (GB)

(73) Assignee: Dunlop Aerospace Limited, Coventry (GB)

( * ) Notice: Subject to any disclaimer, the term of this patent is extended or adjusted under 35 U.S.C. 154(b) by 0 days.

(21) Appl. No.: 09/857,730

(22) PCT Filed: Oct. 22, 1999

(86) PCT No.: PCT/GB99/03508

§ 371 (c)(1), (2), (4) Date: Jun. 8, 2001

(87) PCT Pub. No.: WO00/41983

PCT Pub. Date: Jul. 20, 2000

(30) Foreign Application Priority Data

Jan. 18, 1999 (GB) ................................................ 9901041

(51) Int. Cl.$^7$ .......................... C23C 16/26; C23C 16/32
(52) U.S. Cl. .................................. 427/249.2; 427/249.6
(58) Field of Search ............................ 427/249.2, 249.3, 427/249.21, 255.12, 255.24, 249.6, 249.7; 118/720, 725

(56) References Cited

U.S. PATENT DOCUMENTS

| | | | | |
|---|---|---|---|---|
| 5,348,774 A | * | 9/1994 | Golecki et al. | 427/543 |
| 5,389,152 A | * | 2/1995 | Thurston et al. | 118/429 |
| 6,001,419 A | * | 12/1999 | Leluan et al. | 427/249.2 |

FOREIGN PATENT DOCUMENTS

| | | | | |
|---|---|---|---|---|
| DE | 4142261 A1 | 12/1991 | | |
| DE | 41 42 261 A1 | * 6/1993 | | B29C/67/16 |
| EP | 0592239 A2 | 10/1993 | | |

* cited by examiner

*Primary Examiner*—Timothy Meeks
*Assistant Examiner*—Eric B Fuller
(74) *Attorney, Agent, or Firm*—Caesar, Rivise, Bernstein, Cohen & Pokotilow, Ltd.

(57) ABSTRACT

A porous preform body is infiltrated with carbon by a thermal gradient process using a multi-portion heating element to heat the body. Selected portions of the heating element are supplied with power to create the thermal gradient between different areas of the preform body.

5 Claims, 1 Drawing Sheet

DENSIFICATION OF POROUS BODIES

Figure 1:
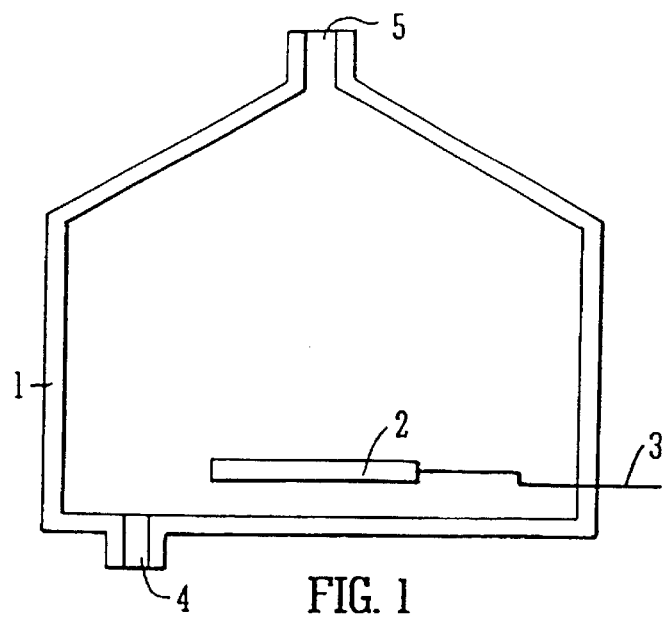

The invention relates to densification of porous bodies. One particular instance is in the densification of porous structural components such as brake discs or pads for aircraft, which typically are made of a porous carbon body infiltrated by carbon.

Many different methods are known for the deposition of a carbon or ceramic matrix on a fibrous substrate of carbon or ceramic fibres. In a thermal gradient process the densification is started at the inside of the substrate or preform and progresses outwards until the whole article is densified. Because the exterior pores of the preform do not become blocked until the centre of the preform is densified, it is found that densification can proceed at a higher rate, reducing processing times and cost compared to the isothermal method of densification.

In all processes where a fibrous substrate is being densified the control of deposition conditions, such as temperature and pressure, is important to ensure the deposition reaction continues at the required rate in order to produce a deposit of the required structure. Where a matrix of carbon is being deposited to manufacture friction discs for aircraft brakes, it can be desirable that the deposit is a graphitisable carbon in order to heat treat the composite to maximise the thermal properties. (The graphitisable form of carbon is often referred to as rough laminar and can be distinguished from the non-graphitisable smooth laminar form by microscopic examination using polarised light).

In thermal gradient deposition heating is commonly by induction heating of a graphite susceptor see, e.g. U.S. Pat. No. 5,348,774 which discloses a process in which the fibrous substrate is in contact with a graphite mandrel which is heated by the electromagnetic field from an induction coil. The fibrous substrate is then heated by conduction from the graphite mandrel. The main problem with this method of establishing the thermal gradient in the preform is the requirement for a susceptor core which might only be usable once if damage is caused during removal from the densified composite.

Another method of producing a thermal gradient in a fibrous substrate for densification is by chemical vapour infiltration (CVI) and is described by J. J. Gebhardt et al in a paper entitled "Formation of carbon-carbon composite materials by pyrolitic infiltration", Petroleum Derived Carbons ACS Ser. No. 21 6/73, pages 212 to 217. In the method of Gebhardt the thermal gradient is maintained by a high rate of gas flow cooling the outer surface of the substrate and by heating only a small volume of the cylindrical substrate in the induction coil, densification of the whole being achieved by moving the substrate inside the induction coil. The substrate is manufactured from graphite fibres which have sufficient electrical conductivity to enable heating of the substrate by direct coupling with the induction coil. Practical constraints on the process make it difficult to apply on an industrial scale and it is unsuitable for other substrate geometry, such as a disc.

U.S. Pat. No. 5,390,152 discloses a method of densification in one version of which (FIG. 6), a porous body is placed on a support between so-called horizontal coils or pancake coils. It is suggested that the spacing between the turns of the coil may be non-uniform in some instances. It is also suggested that as the preform porous body begins to densify the frequency of the applied current may have to be increased to compensate for a decrease in resistivity or the current may need to be increased for decreased resistance.

It is one object of the invention to provide an improved method of densification in which the heating is controlled to improve the rate of deposition after graphitisation.

In one aspect there is provided a method of infiltrating a porous preform body with carbon by heating the body having different portions to a temperature at which carbon-containing gas is crackable to deposit carbon in the pores thereof, the method comprising placing the body adjacent a multi-portion heating element so that the portions thereof align with corresponding portions of the body, and supplying power to the heating element to heat the body whilst exposing the body to a crackable carbon-containing gas; characterised by selectively energising different portions of the multi-portion heating element to create a thermal gradient between one heated body portion and the or each adjacent body portion so as to selectively deposit carbon in the pores of each different heated body portion to provide a graphitisable rough laminar structure.

Preferably adjacent portions of the multi-portion heating element are used to heat adjacent portions of the body to different temperatures whereby to create a thermal gradient between the respective portions of the body.

DE-A-4142261 discloses a method of infiltrating a porous body with a gas stream by means of a heating element the shape of which can be matched to that of the body. The document teaches that for a body having an irregular shape the heating element may be made of plates having a corresponding shape and that such plates may have independent power supplies. There is no suggestion of the creation of a thermal gradient for infiltration.

Preferably the heating element is generally circular. In one variation the heating element comprises a base comprising an induction heating tube shaped into substantially concentric coils, and means are present to power each coil individually. Means may be present to power some coils in combination. In another variation the heating element is made up of vertically aligned coils, arranged to heat layers within the preform.

The porous body will typically be a fibrous preform, of any type. The fibres will be carbon or other suitable fibre.

The infiltrating gas will be one which may be infiltrated by a chemical vapour infiltration technique. The gas may conveniently be provided by a gas vapour or a liquid precursor.

In another aspect the invention provides a method of method of infiltrating a porous preform body with carbon by heating the body having different portions to a temperature at which carbon-containing gas is crackable to deposit carbon in the pores thereof, the method comprising placing the body adjacent a multi-portion heating element so that the portions thereof align with corresponding portions of the body, and supplying power to the heating element to heat the body whilst exposing the body to a crackable carbon-containing gas; characterised by selectively energising different portions of the multi-portion heating element to create a thermal gradient between one heated body portion and the or each adjacent body portion so as to selectively deposit carbon in the pores of each different heated body portion.

Preferably the infiltration of the selected portion is continued until a predetermined level has been achieved following which the process is repeated to adjacent selected portions in succession whereby to infiltrate substantially all of the body to substantially uniform level in a relatively short time period.

Figure 2:
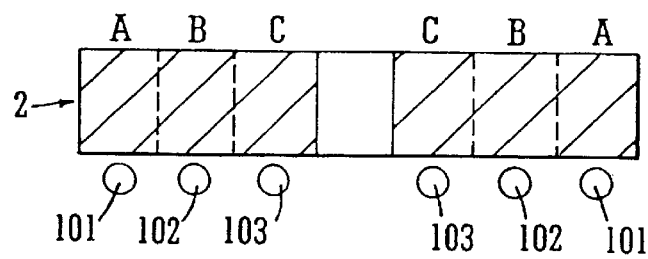
Figure 3:
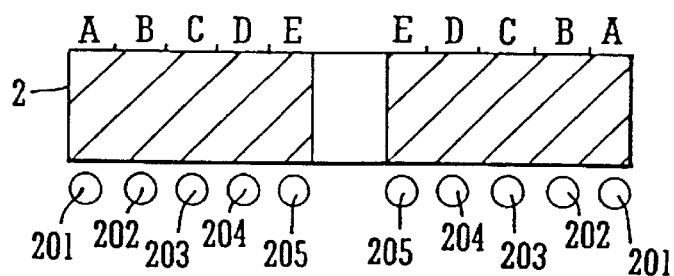
Figure 4:
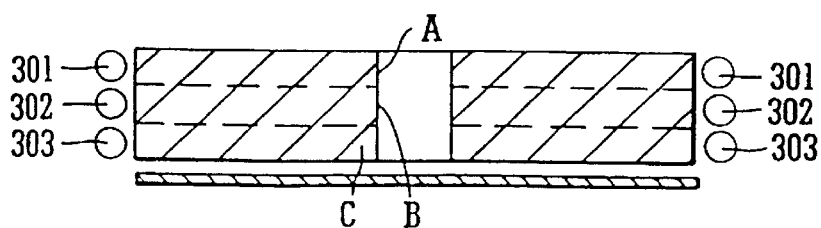

In order that the invention may be well understood it will now be described by way of illustration only with reference to the accompanying diagrammatic drawings in which:

FIG. 1 is a diagrammatic representation of one densification apparatus of the invention; and FIGS. 2 to 4 illustrate different methods of using the heating element in apparatus of FIG. 1.

The densification apparatus comprises a carbon deposition chamber 1 housing a heating base 2 connected by connectors 3 to a source of electric current for induction heating. Carbon-containing gas is pumped via an inlet 4 and is passed over the base 2 to an outlet 5. The basic structure of the chamber is known and therefore will not be described in detail. In use, a fibrous preform P is placed on the base 2 or on an intermediate support, heated and a cyclohexane which is a liquid precursor is pumped through. Of course other liquids and gases may be used.

The element 2 fundamentally comprises a set of metal coils, typically copper, arranged substantially concentrically. The coils may be circular or of other suitable shape. The coils may have a round or rectangular cross-sectional shape. (The coils may be evenly or non-uniformly spaced apart). Each coil is independently powered by induction, e.g. by being coupled to a source of electric current, not shown. The coils may have an individual source operating at a selected frequency, or one generator may be present, together with a switching system to heat up one or more coils. In use, each coil is separately powered to heat up just the overlying portion of the preform, so creating a thermal gradient. Once that portion has been infiltrated the process is repeated on another portion of the preform.

In the embodiment of FIG. 2, the element is a base 2 made up of three concentric coils 101,102,103. A porous fibrous preform P having a central hole is placed on the base, optionally on a plate or support, not shown. Induction heating is applied to each coil which in turn heats up the overlying zone of the preform shown as A,B,C respectively. For example zone A is heated by coil 101, zone B by coil 102 and zone C by coil 103. By heating up individual coils, the heating of the preform is confined to the zone immediately above. The heating will establish one hot zone adjacent an unheated one, so creating a thermal gradient. By heating coils in succession the operator can move the front for densification across the preform, typically from the centre to the periphery. The operator can also heat the coils in different combinations so as to concentrate the densification in selected zones by supplying power to each coil (or combination of coils) to heat up the respective zone(s) to the temperature at which carbon-containing gas can be cracked the operator has better control of the densification. Our investigations have established that this control is important in the deposition of a carbon matrix for the formation of the graphitisable rough laminar structure required for good thermal properties after graphitisation.

In the embodiment of FIG. 3, the base has five coils 201,202,203,204 and 205, each associated with a zone A,B,C,D,E. Because of the mutliplicity of coils different coils may be energised together, e.g. first coil 203, followed by coils 202 and 204 and then by coils 201 and 205. In this way the preform is progressively heated outwards from the centre.

In the embodiment of FIG. 4 the coils 301,302 and 303 are arranged vertically to heat horizontal zones or layers A,B,C within the preform. Again the coils may be energised selectively. In this case the preform P is mounted on a supporting plate of suitable electrical and heat insulation properties.

Our evaluations have established that using the method of the invention one can infiltrate at a preform at a relatively faster rate to provide a body of controlled microstructure. The method allows the operator to change the temperatures easily, so that he has better control over the thermal gradient.

The invention is not limited to the embodiments shown. The distance between coils need not be uniform. The preform need not have a hole. The coils may be of any suitable cross-sectional shape. A preform may be placed on a support. The preform may be heated from above as well as below. A number of deposition chambers may be arranged with identical bases, heated by a common generator or generators. The deposit may be carbon or a ceramic matrix. Layers of heating elements and preforms may be stacked in any sequence for selective heating.

What is claimed is:

1. A method of infiltrating different portions of a porous preform body with carbon by heating the body to a temperature at which carbon-containing gas is crackable to deposit carbon in the pores thereof, the method comprising placing the body adjacent a multi-portion heating element shaped into substantially concentric coils so that the coils thereof align with corresponding portions of the body, and supplying power to the heating element to heat the body whilst exposing the body to a crackable carbon-containing gas whereby carbon is deposited in the pores of the heated portion; and including the step of selectively energising different coils of the multi-portion heating element to create a thermal gradient between one heated body portion and the or each adjacent body portion so as to propagate an infiltration front from the centre to the periphery of the preform body and selectively deposit carbon in the pores of each different heated body portion to provide a graphitisable rough laminar structure.

2. A method according to claim 1 comprising providing, as the heating element, an induction heating element made up of horizontally spaced coils, disposing the coils about the body and heating vertically defined portions thereof.

3. A method according to claim 1 further comprising providing each portion of the heating element with a respective power supply.

4. A method according to claim 1 further comprising supplying power to the portions of the heating element from a common power source, power being supplied to a selected portion of the heating element by virtue of switch means.

5. A method according to claim 1, comprising continuing the heating and infiltration of one selected portion of the body until a predetermined level of carbon deposition has been achieved followed by performing the method with adjacent selected portions in succession whereby substantially all of the body has carbon deposited therein to a substantially uniform level.

* * * * *